US008362849B2

(12) United States Patent
White

(10) Patent No.: US 8,362,849 B2
(45) Date of Patent: Jan. 29, 2013

(54) BROADBAND BALUN

(75) Inventor: Mikel J. White, Murphy, TX (US)

(73) Assignee: Raytheon Company, Waltham, MA (US)

( * ) Notice: Subject to any disclaimer, the term of this patent is extended or adjusted under 35 U.S.C. 154(b) by 392 days.

(21) Appl. No.: 12/839,438

(22) Filed: Jul. 20, 2010

(65) Prior Publication Data

US 2012/0019333 A1 Jan. 26, 2012

(51) Int. Cl.
*H03H 7/42* (2006.01)
*H01P 3/08* (2006.01)

(52) U.S. Cl. .......................................... 333/25; 333/238

(58) Field of Classification Search .................... 333/25, 333/26, 33, 238

See application file for complete search history.

(56) References Cited

U.S. PATENT DOCUMENTS

| | | | | |
|---|---|---|---|---|
| 4,085,391 | A * | 4/1978 | Schiek et al. | 333/33 |
| 5,610,563 | A | 3/1997 | Mohwinkel | |
| 6,052,039 | A | 4/2000 | Chiou et al. | |
| 6,075,493 | A * | 6/2000 | Sugawara et al. | 343/767 |
| 6,657,601 | B2 | 12/2003 | McLean | |
| 7,265,644 | B2 * | 9/2007 | Floyd et al. | 333/26 |
| 7,449,975 | B2 | 11/2008 | Hoover | |
| 7,557,673 | B1 | 7/2009 | Meharry | |
| 2002/0097107 | A1 | 7/2002 | Burns et al. | |
| 2006/0038732 | A1 | 2/2006 | DeLuca et al. | |
| 2009/0115548 | A1 | 5/2009 | Hamada et al. | |
| 2010/0079220 | A1 | 4/2010 | Trott et al. | |

FOREIGN PATENT DOCUMENTS

WO 98/13894 4/1998

OTHER PUBLICATIONS

Jokanovic, et al., "Balance Measurements in Double-Y Baluns," IEE Proc.-Micros. Antennas Propag., vol. 149, No. 56, pp. 257-260 (2002).

Kim, et al., "Ultra-Wideband (from DC to 110 GHz) CPW to CPS Transition," Electronics Letters, vol. 38, No. 13, pp. 622-623 (Jun. 20, 2002).

Llamas, et al., "Compact, Wideband CPW-to-Slotline Multimodal Transition," Proceedings of the 37th European Microwave Conference, pp. 897-900 (Oct. 2007).

Ting-Huei Lin et al., CPW to Waveguide Transition with Tapered Slotline Probe, IEEE Microwave and Wireless Components Letters, Jul. 2001, pp. 314-316, vol. 11, No. 7, IEEE Xplore.

George E. Ponchak et al., Excitation of Coupled Slotline Mode in Finite-Ground CPW With Unequal Ground-Plane Widths, IEEE Transactions on Microwave Theory and Techniques, Feb. 2005, pp. 713-717, vol. 53, No. 2.

Miquel Ribo et al., Circuit Model for Coplanar-Slotline Tees, IEEE Microwave and Guided Wave Letters, May 2000, pp. 177-179, vol. 10, No. 5.

* cited by examiner

*Primary Examiner* — Dean O Takaoka

(74) *Attorney, Agent, or Firm* — Pierce Atwood LLP; Joseph M. Maraia

(57) ABSTRACT

In some embodiments, the technology includes a balun. The balun includes an un-balanced line, a balanced line, a double-y transition section, a first connection section, and a second connection section. The un-balanced line includes a ground trace and a signal trace. The balanced line includes a first and second signal trace. The double-y transition section includes a first slot trace and a second slot trace. The first slot trace couples the ground trace of the un-balanced line to the first signal trace of the balanced line. The second slot trace couples the signal trace of the un-balanced line to the second signal trace of the balanced line. The first connection section couples the first slot trace to the first signal trace of the balanced line. The second connection section couples the second slot trace to the second signal trace of the balanced line.

16 Claims, 5 Drawing Sheets

500

BROADBAND BALUN

GOVERNMENT SUPPORT

The U.S. Government may have certain rights in this invention as provided for by the terms of Contract No. (classified) awarded by (classified).

BACKGROUND

A balun is a circuit transformer that combines two out-of-phase signals into a common port, or splits the common signal into two out-of-phase signals. Baluns are utilized for antenna feeds, high-efficiency amplifier techniques, and broadband 2nd-order cancellation. Previous attempts of baluns, generally, have a limited bandwidth, typically 3:1. For printed-circuit type applications, a Marchand balun is widely used with bandwidths of 3:1 having been demonstrated. However, current high frequency baluns, including the Marchand Balun, have high insertion loss and do not operate effectively at high frequencies.

Therefore, a need exists in the art for a broadband balun with the features as described herein.

SUMMARY

One approach to a broadband balun includes an un-balanced line, a balanced line, a double-y transition section, a first connection section, and a second connection section. The un-balanced line includes a ground trace and a signal trace. The balanced line includes a first and second signal trace. The double-y transition section includes a first slot trace and a second slot trace. The first slot trace couples the ground trace of the un-balanced line to the first signal trace of the balanced line. The second slot trace couples the signal trace of the un-balanced line to the second signal trace of the balanced line. The first connection section couples the first slot trace of the double-y transition section to the first signal trace of the balanced line. The second connection section couples the second slot trace of the double-y transition section to second signal trace of the balanced line.

Another approach to a broadband balun is a balun circuit. The circuit includes an un-balanced line, a balanced line, a double-y transition slotline, a first connection section, and a second connection section. The un-balanced line includes a first center conductor and first and second coplanar conductors. The balanced line includes a second center conductor and third and fourth coplanar conductors. The double-y transition slotline includes a first conductor and a second conductor. The first conductor couples the first center conductor to the third and fourth coplanar conductors. The second conductor couples the first and second coplanar conductors to the second center conductor. The first connection line couples the first conductor to the third and fourth coplanar conductors. The second connection line couples the first and second coplanar conductors to the second center conductor.

In other examples, any of the approaches above can include one or more of the following features.

In some examples, the un-balanced line includes an un-balanced coplanar waveguide (CPW) line.

In other examples, the balanced line includes a balanced coplanar waveguide (CPW) line.

In some examples, the double-y transition section includes a coupled slotline.

In other examples, the coupled slotline includes first and second conductors mounted on a substrate.

In other examples, the first signal trace is a center conductor of the balanced line.

In some examples, the first connection section includes a first metal interconnection and the second connection section includes a second metal interconnection.

In other examples, the first connection section includes a first microstrip and the second connection section includes a second microstrip.

In some examples, power input into the un-balanced line and power output from the balanced line is substantially the same.

In other examples, the first connection line includes a first metal interconnection and the second connection line includes a second metal interconnection.

In some examples, the first connection line includes a first microstrip and the second connection line includes a second microstrip.

The technology described herein can provide one or more of the following advantages. The technology advantageously has, at least, a 72:1 bandwidth on a monolithic microwave integrated circuit (MMIC) and enables easy integration in a standard MMIC fabrication process, thereby reducing the manufacturing cost of the broadband balun and increasing the effectiveness of the signal transformation. The technology advantageously has a low insertion loss, is compact compared to alternative solutions, and is less expensive than alternative solutions to manufacture.

BRIEF DESCRIPTION OF THE DRAWINGS

The foregoing and other objects, features and advantages will be apparent from the following more particular description of the embodiments, as illustrated in the accompanying drawings in which like reference characters refer to the same parts throughout the different views. The drawings are not necessarily to scale, emphasis instead being placed upon illustrating the principles of the embodiments.

DETAILED DESCRIPTION

As a general overview of the technology, a broadband balun is a stand-alone 180 degree power splitter. The balun, as described herein, operates in the broadband frequency range. The balun has, for example, a 72:1 bandwidth, with low loss and is implemented utilizing standard monolithic microwave integrated circuit (MMIC) processing technology. This technology provides a broadband, low-loss, compact structure that is easily integrated in MMIC or board processing where baluns are utilized.

The technology includes a double-y transition and a coplanar waveguide (CPW). The double-y transition achieves broadband performance and converts the CPW to a slotline and vice versa. The technology can further include a coplanar waveguide (CPW)-T to convert the slotline (e.g., coplanar stripline (CPS) fields) from the double-y transition, thereby providing the low-loss broadband balun as described herein.

An advantage of the double-y transition is that the fine lithography of MMIC fabrication technology enables a double-y transition to operate at high frequencies with low loss, thereby increasing the efficiency of the technology. An advantage of the use of the CPW-T is that the CPW-T enables the balun to have a small size, thereby enabling the balun to operate at high frequencies without a large physical size. An advantage of the MMIC fabrication technology of the balun enables the ground-plane to be positioned close to the other components of the balun, thereby enabling the balun to be efficiently utilized in high-frequency applications by reducing the time for transformation of the electrical signals while reducing interface between the electrical signals.

Figure 1:
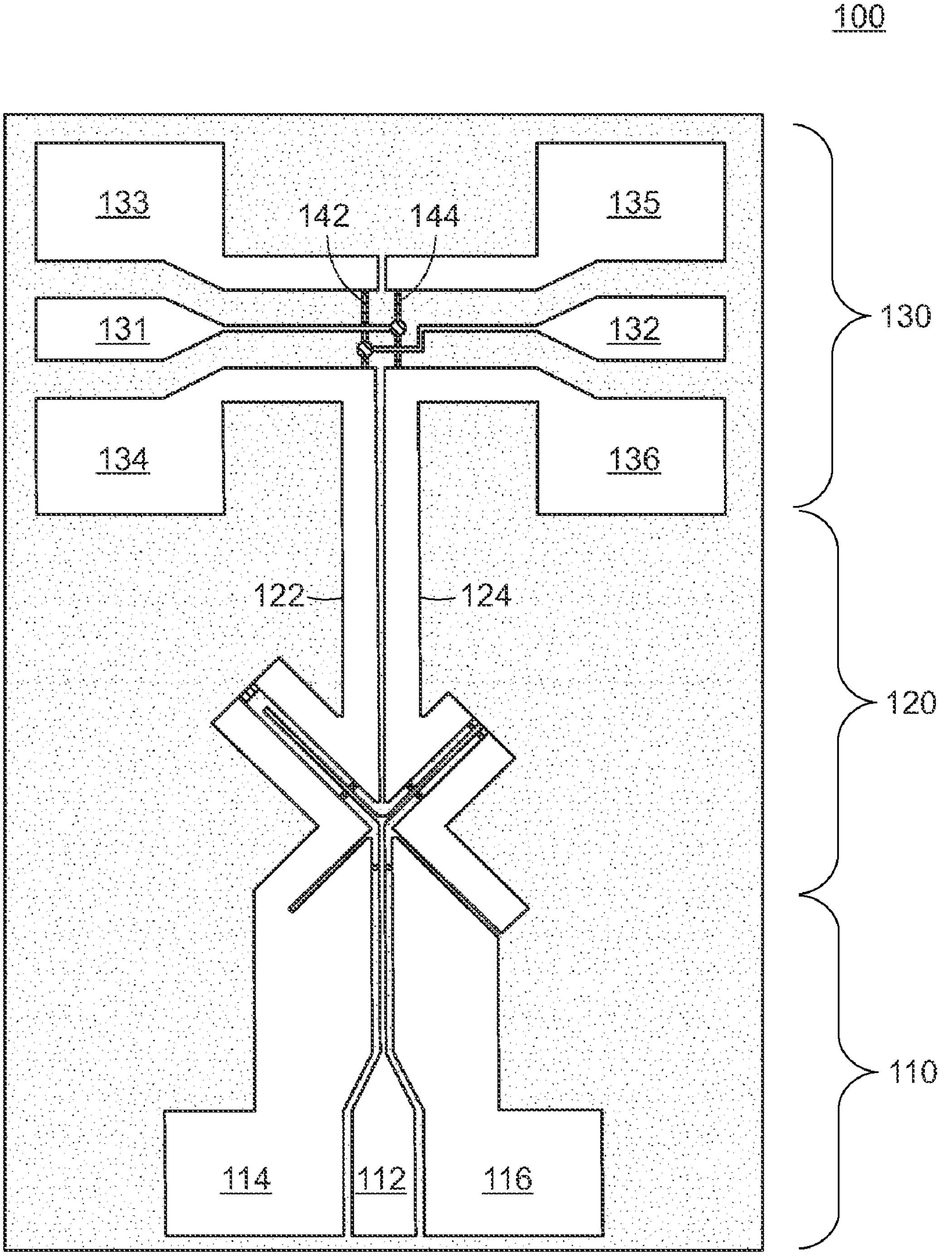
FIG. 1 is a circuit diagram of an exemplary broadband balun.

FIG. 1 is a circuit diagram of an exemplary broadband balun 100. The balun 100 includes an un-balanced line 110 (e.g., coaxial cable, ribbon cable, twinax cable, etc.), a double-y transition slotline 120, and a balanced line 130 (e.g., twisted pair cable, ladder cable, etc.). The un-balanced line 110 includes a center conductor 112 and two equal potential coplanar conductors 114 and 116. The double-y transition slotline 120 includes two conductors 122 and 124. The balanced line 130 includes center conductor 131 and 132 and coplanar conductors 133, 134, 135, and 136. The balun 100 can be, for example, utilized to convert electrical signals from the un-balanced line 110 (i.e., un-balanced electrical signal) to the balanced line 130 (i.e., balanced electrical signal) and vice versa.

The conductor 122 of the double-y transition slotline 120 couples the signal potential at conductor 122, which is electromagnetically coupled to the center conductor 112 of the un-balanced line 110, to the coplanar conductors 133 and 134 and to the center conductor 132 of the balanced line 130. The conductor 124 of the double-y transition slotline 120 couples the signal potential at conductor 124, which is electromagnetically coupled to the two coplanar conductors 111 and 116 of the un-balanced line 110, to the coplanar conductors 135 and 136 and to the center conductor 131 of the balanced line 130.

The balanced line 130 further includes two connection lines 142 and 144. The connection line 142 (referred to as the first connection line) couples the conductor 122 of the double-y transition slotline 120 to the coplanar conductors 133 and 134 and the center conductor 132 of the balanced line 130. The connection line 144 (referred to as the second connection line) couples the conductor 124 of the double-y transition slotline 120 to the coplanar conductors 135 and 136 and to the center conductor 131 of the balanced line.

In some examples, the un-balanced line 110 includes an un-balanced coplanar waveguide (CPW) line and/or any other type of dielectric waveguide (e.g., microstrip, stripline, etc.).

In other examples, the double-y transition slotline 120 includes a coupled slotline and/or any other type of dielectric waveguide.

In some examples, the balanced line 130 includes a balanced coplanar waveguide (CPW) line and/or any other type of dielectric waveguide.

In other examples, the first connection line 142 includes a first metal interconnection and the second connection line 144 includes a second metal interconnection. In some examples, the first connection line 142 includes a first microstrip and the second connection line 144 includes a second microstrip.

In some examples, the power input into the un-balanced line 110 and power output from the balanced line 130 is substantially the same (e.g., exactly, within +5%, within −10%, etc.).

Although FIG. 1 illustrates specific delineations of the un-balanced line 110, the double-y transition slotline 120, and the balanced line 130 for illustration purposes, the delineations between the lines 110, 120, and 130 are, in some examples, are substantially accurate, and, in other examples, the delineations between the lines 110, 120, and 130 can be substantially placed in different locations.

Figure 2:
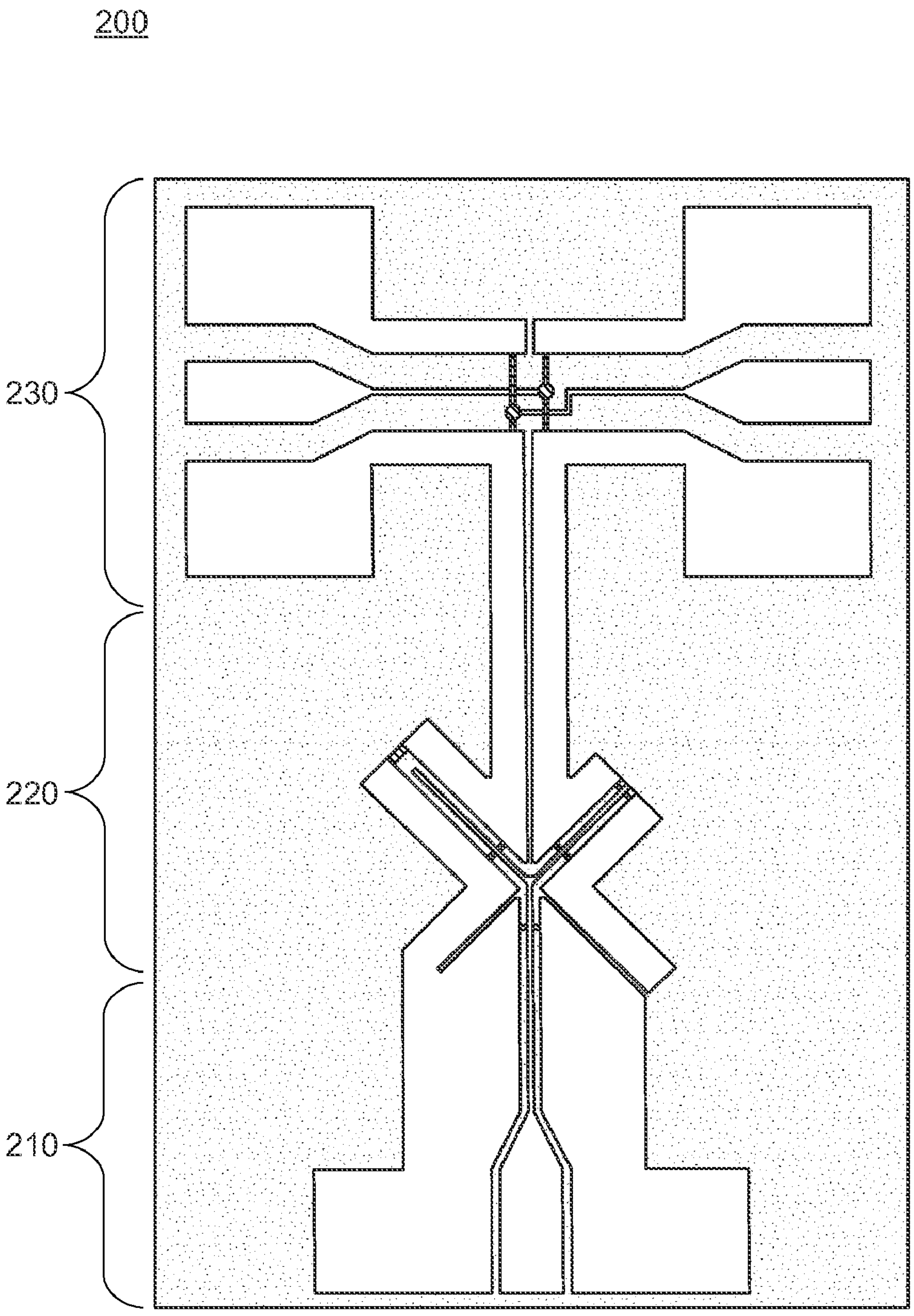
FIG. 2 is a circuit diagram of another exemplary broadband balun.

FIG. 2 is a circuit diagram of another exemplary broadband balun 200. The balun 200 includes an un-balanced line 210 (e.g., single-ended, not balanced around a ground, etc.), a double-y transition section 220, and a balanced line 230 (e.g., double-ended, balanced around a ground, differential line, etc.). The balun 200 utilizes electromagnetic coupling to convert the un-balanced line 210 to the balanced line 230 and vice versa. In other words, the un-balanced line 210 and the double-y transition section 220 are electromagnetically coupled via a double-y transition in the double-y transition section 220.

The double-y transition section 220 can, for example, convert the un-balanced line 210 (e.g., 50 ohm CPW line, 100 ohm CPW line, etc.) to a slotline. The slotline of the double-y transition section 220 can, for example, feed a CPW-T structure (e.g., two CPW lines branching from the slotline of the double-y transition section 220 in the shape of a "T", two 95 ohm CPW lines, two 125 ohm CPW lines, T junction, etc.) of the balanced line 230. In this example, each set of the center conductors and the opposing coplanar conductors, respectively, of the CPW-T structure are connected to a side of the slotline of the double-y transition section 220 via an interconnect (e.g., a metal interconnect, a microstrip interconnect, etc.).

The balun 200 can be, for example, utilized to connect lines with the same or different impedances (e.g., the un-balanced line 210 and the balanced line 230 have the same impedance, the un-balanced line 210 and the balanced line 230 have different impedances, etc.). For example, the impedance of the un-balanced line 210 is 50 ohms and the impedance of the balanced line 230 is 95 ohms. As another example, the impedance of the un-balanced line 210 is 115 ohms and the impedance of the balanced line 230 is 45 ohms. The balun 200 can advantageously provide a high frequency and low loss conversion between un-balanced and balanced lines, thereby increasing the efficient transfer of signals between different types of lines.

The un-balanced line 210 can, for example, include a ground trace and a signal trace. The balanced line 230 can, for example, include a first and second signal trace. The first signal trace can, for example, be a center conductor of the balanced line 210.

The double-y transition section 220 can, for example, include a first slot trace and a second slot trace. The first slot trace can couple the ground trace of the un-balanced line 210 to the first signal trace of the balanced line 230. The second slot trace can couple the signal trace of the un-balanced line 210 to the second signal trace of the balanced line 230.

In some examples, the balun 200 includes a first connection section and a second connection section. The first connection section can couple (e.g., direct connection, electromagnetic coupling, etc.) the first slot trace of the double-y transition section 220 to the first signal trace of the balanced line 210. The second connection section can couple the second slot trace of the double-y transition section 220 to the second signal trace of the balanced line 230.

In other examples, the first connection section includes a first metal interconnection and/or the second connection section includes a second metal interconnection.

In some examples, the first connection section includes a first microstrip and/or the second connection section includes a second microstrip.

In some examples, the un-balanced line 210 includes an un-balanced coplanar waveguide (CPW) line and/or any other type of dielectric waveguide.

In other examples, the double-y transition section 220 includes a coupled slotline and/or any other type of dielectric waveguide. The coupled slotline can, for example, include first and second conductors mounted on a substrate.

In some examples, the balanced line 230 includes a balanced coplanar waveguide (CPW) line and/or any other type of dielectric waveguide.

In some examples, the power input into the un-balanced line 210 and power output from the balanced line 230 is substantially the same (e.g., exactly the same, within ±10%, within ±100 watts, etc.), thereby enabling the balun 200 to be low loss and highly efficient.

Although FIG. 2 illustrates the balanced line 230 as a CPW-T structure, the balun 200 can be, for example, any type of structure. For example, the balanced line 230 is a CPW-F structure (i.e., two CPW lines branching from the slotline of the double-y transition section 220 in the shape of a "F" structure) and/or any other configuration based on the design specifications of the balun 200.

Although FIG. 2 illustrates specific delineations of the un-balanced line 210, the double-y transition section 220, and the balanced line 230 for illustration purposes, the delineations between the lines 210, 220, and 230 are, in some examples, are substantially accurate, and, in other examples, the delineations between the lines 210, 220, and 230 can be substantially placed in different locations.

Figure 3:
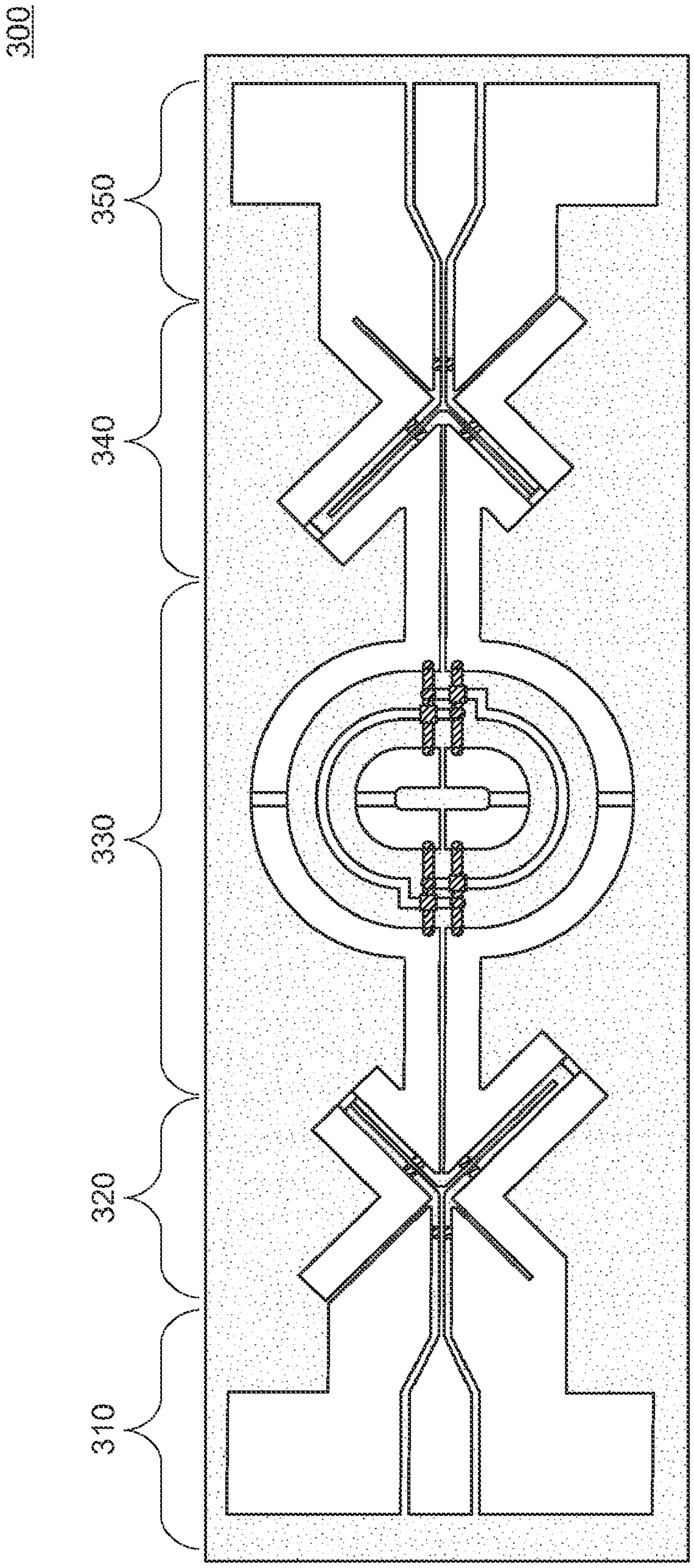
FIG. 3 is a circuit diagram of an exemplary testing configuration for broadband baluns.

FIG. 3 is a circuit diagram of an exemplary testing configuration for broadband baluns 300. The baluns 300 includes a first un-balanced line 310, a first double-y transition slotline 320, balanced line 330, a second double-y transition slotline 340, and a second un-balanced line 350. The testing configuration for broadband baluns 300 is utilized to measure insertion loss between the input in the first un-balanced line 310 and the output from the second un-balanced line 350.

Although FIG. 3 illustrates specific delineations of the first un-balanced line 310, the first double-y transition slotline 320, the balanced line 330, the second double-y transition slotline 340, and the second un-balanced line 350 for illustration purposes, the delineations between the lines 310, 320, 330, 340, and 350 are, in some examples, are substantially accurate, and, in other examples, the delineations between the lines 310, 320, 330, 340, and 350 can be substantially placed in different locations.

Figure 4:
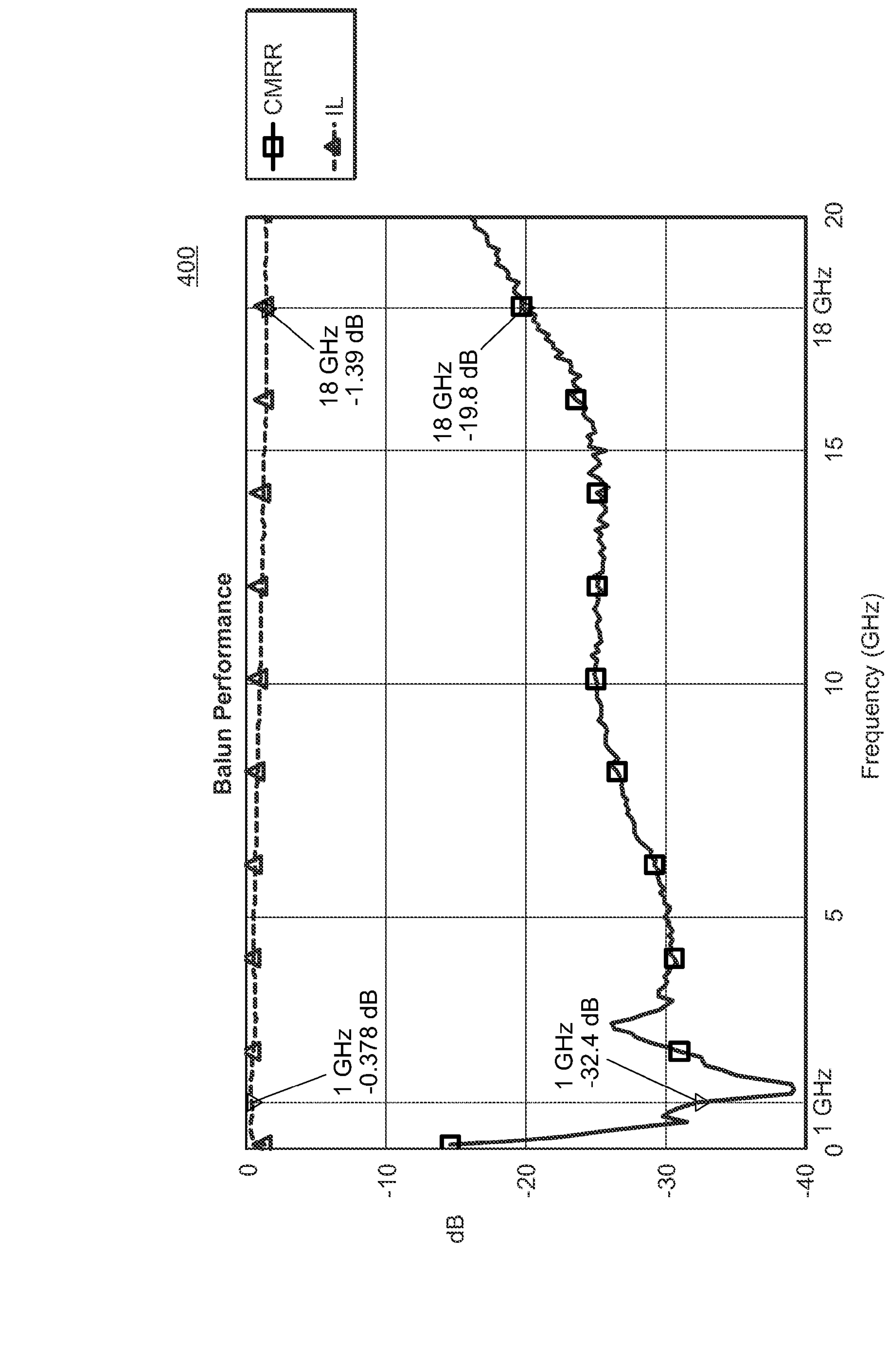
FIG. 4 is a chart illustrating performance of an exemplary broadband balun.

FIG. 4 is a chart 400 illustrating performance of an exemplary broadband balun, as illustrated in the balun 300 of FIG. 3. As shown in FIG. 4, the balun was simulated over a frequency range of 0-20 GHz. As illustrated, the insertion loss (IL) was from 0.4 to 1.4 dB over the frequency range. In this test, half of the measured insertion loss is the insertion loss of one of the baluns since the baluns are connected in series. For this test, the projected insertion loss was from 0.3 to 0.9 dB for each balun. As illustrated, the common mode rejection (CMRR), which was a test to feed an unbalanced signal through the balanced line, was from 32.4 to 19.8 dB over the frequency range. As a further test that is not illustrated in FIG. 3, a 20 dB rejection was achieved over a frequency range of 250 MHz to 18 GHz. Another advantage of the balun is the low loss performance at high frequencies on board-compatible technologies (e.g., MMIC), thereby increasing the performance capabilities of the balun while decreasing the manufacturing costs.

Figure 5:
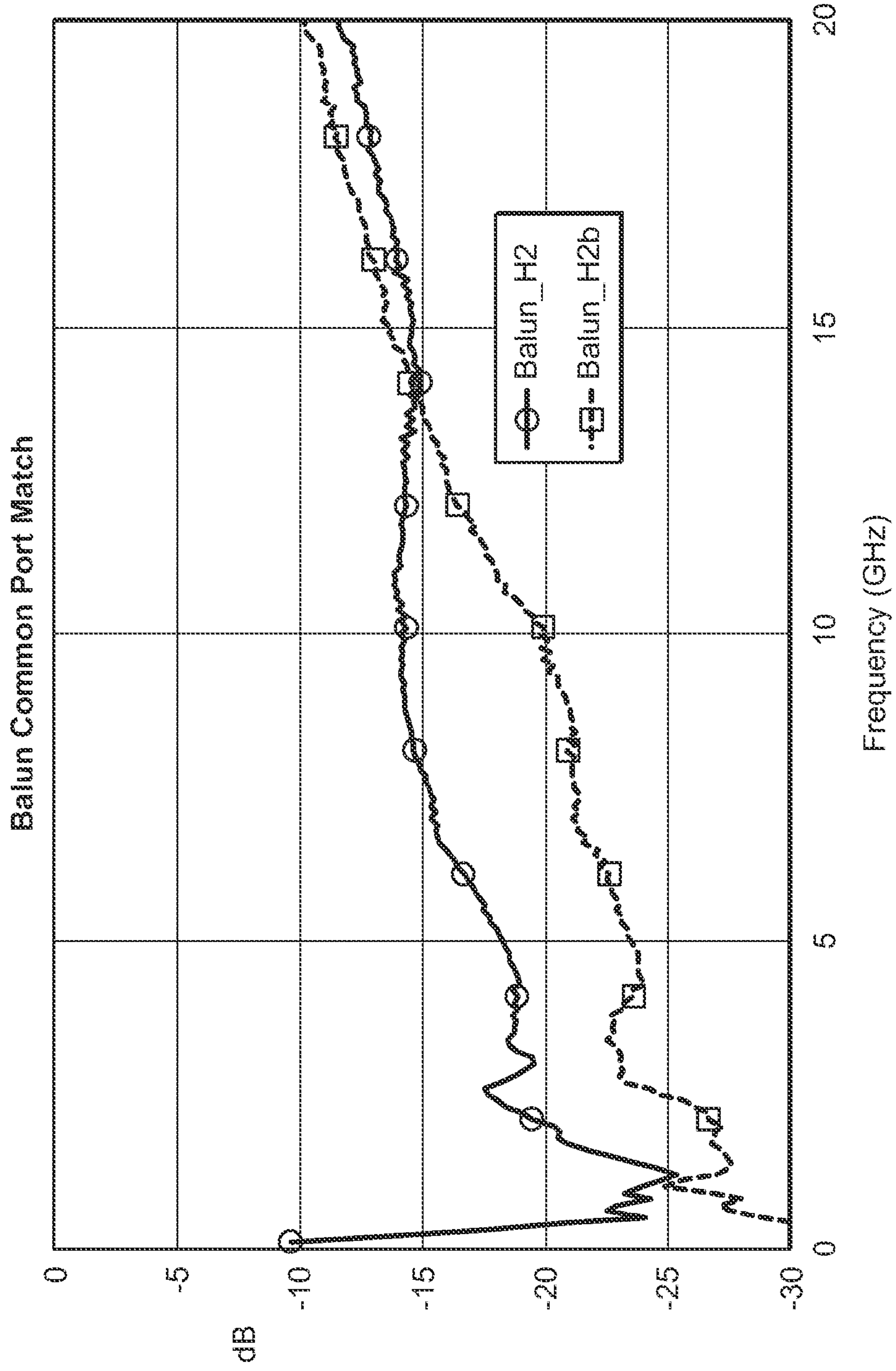
FIG. 5 is a chart illustrating performance of an exemplary testing configuration for broadband baluns.

FIG. 5 is a chart 500 illustrating performance of an exemplary testing configuration for broadband baluns, as illustrated in the baluns 100 and 200 of FIGS. 1 and 2, respectively. As shown in FIG. 5, the balun was simulated over a frequency range of 0-20 GHz. As illustrated, the common ports of the balanced lines were measured (in this example, Balun_H2 is the top termination and Balun_H2b is the bottom termination). The performance of the balance of the amplitudes of the input and the output signals of the balun, as illustrated in the chart 500, is indicative of the closeness of the phase differential to 180 degrees. Another advantage of the balun is the closeness of the phase differential to 180 degrees, thereby maximizing the combining efficiency and linearity (for example, in a harmonic cancellation system, the phase differential could result in a 20 dB reduction in unwanted harmonic content).

The coupling of lines and/or conductors can include, for example, a direct physical connection, an indirect physical connection, an electromagnetic connection, and/or any other type of direct or indirect coupling.

Comprise, include, and/or plural forms of each are open ended and include the listed parts and can include additional parts that are not listed. And/or is open ended and includes one or more of the listed parts and combinations of the listed parts.

One skilled in the art will realize the invention may be embodied in other specific forms without departing from the spirit or essential characteristics thereof. The foregoing embodiments are therefore to be considered in all respects illustrative rather than limiting of the invention described herein. Scope of the invention is thus indicated by the appended claims, rather than by the foregoing description, and all changes that come within the meaning and range of equivalency of the claims are therefore intended to be embraced therein.

What is claimed is:

1. A balun comprising:

an un-balanced line comprising a ground trace and a signal trace;

a balanced line comprising a first and second signal trace;

a double-y transition section comprising a first slot trace and a second slot trace, wherein:

the first slot trace couples the ground trace of the un-balanced line to the first signal trace of the balanced line, and the second slot trace couples the signal trace of the un-balanced line to the second signal trace of the balanced line;

a first connection section coupling the first slot trace of the double-y transition section to the first signal trace of the balanced line; and a second connection section coupling the second slot trace of the double-y transition section to second signal trace of the balanced line.

2. The balun of claim 1, wherein the un-balanced line comprising an un-balanced coplanar waveguide (CPW) line.

3. The balun of claim 1, wherein the balanced line comprising a balanced coplanar waveguide (CPW) line.

4. The balun of claim 1, wherein the double-y transition section comprising a coupled slotline.

5. The balun of claim 4, wherein the coupled slotline comprising first and second conductors mounted on a substrate.

6. The balun of claim 1, wherein the first signal trace is a center conductor of the balanced line.

7. The balun of claim 1, wherein the first connection section comprising a first metal interconnection and the second connection section comprising a second metal interconnection.

8. The balun of claim 1, wherein the first connection section comprising a first microstrip and the second connection section comprising a second microstrip.

9. The balun of claim 1, wherein power input into the un-balanced line and power output from the balanced line is substantially the same.

10. A balun circuit, the circuit comprising:

an un-balanced line comprising a first center conductor and first and second coplanar conductors;

a balanced line comprising a second center conductor and third and fourth coplanar conductors;

a double-y transition slotline comprising a first conductor and a second conductor, wherein:

the first conductor couples the first center conductor to the third and fourth coplanar conductors, and the second conductor couples the first and second coplanar conductors to the second center conductor;

a first connection line coupling the first conductor to the third and fourth coplanar conductors; and a second connection line coupling the first and second coplanar conductors to the second center conductor.

11. The circuit of claim 10, wherein the un-balanced line comprising an un-balanced coplanar waveguide (CPW) line.

12. The circuit of claim 10, wherein the balanced line comprising a balanced coplanar waveguide (CPW) line.

13. The circuit of claim 10, wherein the double-y transition section comprising a coupled slotline.

14. The circuit of claim 10, wherein the first connection line comprising a first metal interconnection and the second connection line comprising a second metal interconnection.

15. The circuit of claim 10, wherein the first connection line comprising a first microstrip and the second connection line comprising a second microstrip.

16. The circuit of claim 10, wherein power input into the un-balanced line and power output from the balanced line is substantially the same.

* * * * *